US006177228B1

(12) United States Patent
Allen et al.

(10) Patent No.: US 6,177,228 B1
(45) Date of Patent: *Jan. 23, 2001

(54) PHOTORESIST COMPOSITION AND PROCESS FOR ITS USE

(75) Inventors: Robert David Allen; Richard Anthony DiPietro; Ratnam Sooriyakumaran, all of San Jose; Thomas I. Wallow, Union City; Gregory Michael Wallraff, Morgan Hill, all of CA (US)

(73) Assignee: International Business Machines Corporation, Armonk, NY (US)

( * ) Notice: This patent issued on a continued prosecution application filed under 37 CFR 1.53(d), and is subject to the twenty year patent term provisions of 35 U.S.C. 154(a)(2).

Under 35 U.S.C. 154(b), the term of this patent shall be extended for 0 days.

This patent is subject to a terminal disclaimer.

(21) Appl. No.: 08/928,308

(22) Filed: Sep. 12, 1997

(51) Int. Cl.$^7$ .................................................. G03F 7/004
(52) U.S. Cl. ..................................... 430/270.1; 430/281.1; 430/288.1; 430/326; 430/905; 430/906; 430/910

(58) Field of Search ............................... 430/270.1, 905, 430/906, 910, 281.1, 288.1, 326

(56) References Cited

U.S. PATENT DOCUMENTS

| 5,372,912 | * | 12/1994 | Allen et al. | .................. | 430/270.1 |
| 5,374,500 | * | 12/1994 | Carpenter, Jr. et al. | ............. | 430/910 |
| 5,585,222 | * | 12/1996 | Kaimoto et al. | .................. | 430/270.1 |
| 5,587,274 | * | 12/1996 | Kishida et al. | .................... | 430/270.1 |

\* cited by examiner

*Primary Examiner*—John S. Chu
(74) *Attorney, Agent, or Firm*—Robert B. Martin; Dianne E. Reed

(57) ABSTRACT

The present invention relates to a radiation-sensitive resist composition comprising a radiation-sensitive acid generator and a copolymer binder formed by the reaction of (a) an acrylate or methacrylate monomer having a photogenerated acid cleavable substituent and (b) an acrylate or methacrylate monomer having a polar non photoacid cleavable substituent.

47 Claims, No Drawings

PHOTORESIST COMPOSITION AND PROCESS FOR ITS USE

TECHNICAL FIELD

The present invention relates to an improved lithographic photoresist composition and process for its use in the manufacture of integrated circuits.

BACKGROUND OF THE INVENTION

There is a desire in the industry for higher circuit density in microelectronic devices which are made using lithographic techniques. One method of increasing the number of components per chip is to decrease the minimum feature size on the chip, which requires higher lithographic resolution. The use of shorter wavelength radiation (e.g., ultra deep UV, e.g., 193 nm) than the currently employed mid-UV spectral range (e.g., 248–450 nm) offers the potential for higher resolution. However, with deep UV radiation, fewer photons are transferred for the same energy dose and higher exposure doses are required to achieve the same desired photochemical response. Further, current lithographic resists absorb strongly at 193 nm due to aromaticity making them unsuitable for commercial use at 193 nm.

Acrylate and methacrylate resists are known in the art. For example, Allen U.S. Pat. No. 5,071,730 discloses a resist comprising a terpolymer of methyl methacrylate, t-butyl methacrylate and methacrylic acid. Allen teaches that the t-butyl group imparts acid sensitivity, the acid group influences development rate and the methyl ester increases toughness of the film. Although this resist is suitable for some commercial uses, it is deficient in that it has low reactive ion etch resistance. Reactive ion etch resistance is desired for processing in semiconductor manufacturing. Further, excessive amounts of acid in the polymer will result in thinning in the unexposed areas during development.

Nozaki et al., J. of Photopolym. Sci. Technol., Vol. 9, 1993, 509, discloses a methacrylate resist having two acid cleavable ester groups, adamantyl and pyranyl groups. The author states that the resist develops well probably due to the high acid content of the exposed areas resulting from the cleavage of both leaving groups. However, the unexposed areas of the resist will experience substantial cracking during postexposure bake due to the large shrinkage in the exposed area with the removal of the large ester groups.

The requirements for photoresists for semiconductor manufacturing include etch resistance, clean aqueous development and compatibility with strong developers currently in use in semiconductor manufacturing. Traditional DUV resists (248 nm) combine these functions quite easily by using poly(hydroxystyrene), a phenolic resin, as the polymer of choice. This material has unacceptably high optical density for 193-nm lithography. Combining these requirements in a polymer that is nearly transparent at both 193 nm and 248 nm is a significant challenge.

It is therefore an object of the present invention to provide a radiation-sensitive (meth) acrylate resist composition which has improved sensitivity and resolution.

Other objects and advantages will become apparent from the following disclosure.

SUMMARY OF THE INVENTION

The present invention relates to a chemically-amplified, radiation-sensitive resist composition comprising a photosensitive acid generator and an acrylate or methacrylate polymer formed by reacting an acrylate or methacrylate monomer having (a) a photogenerated acid cleavable ester substituent and (b) a monomer having the formula $$H_2C=CRR'$$

where R is hydrido or methyl and R' is a polar, non photoacid cleavable substituent having the formula

 (i)

 (ii)

 (iii)

where A is a spacer group and R* is a polar group having one or more heteroatom with a Pauling electronegativity greater than 3.00. The photoresist adheres well to the substrate and develops cleanly without thinning or residue formation. The acrylate or methacrylate polymer uniquely separates the polar functionality needed for development from the photoacid cleavable functionality to avoid excessive thinning and still achieve clean development. The present invention also relates to the use of the resist composition to make integrated circuits.

A more thorough disclosure of the present invention is presented in the detailed description which follows.

DESCRIPTION OF THE PREFERRED EMBODIMENT

The present invention relates to a chemically amplified, positive tone, radiation-sensitive composition comprising (a) photo sensitive acid generator; (b) a polymer formed by the reaction of (a) an acrylate or methacrylate monomer having photogenerated acid cleavable substituent and (b) an acrylate or methacrylate monomer having a polar non photoacid cleavable substituent.

The polymer in the resist composition is the reaction product of a plurality of monomers. The first monomer $H_2C=CRR'$ has a polar substituent R' which is not cleavable in the presence of a photogenerated acid, e.g., an ester group which does not cleave in the absence of water because it does not form a stable carbonium ion. However, the polarity of the substituent R' enhances the development of the resist without causing problems associated with excessive acid formation. Suitable polar substituents R' have the formula:

 (i)

 (ii)

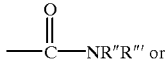 (iii)

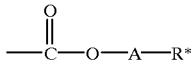

where A is a spacer group R is hydrido or methyl, R" and R'" are independently hydrido, alkyl ($C_{1-6}$) or AR* and R* is a polar organic group having a heteroatom having an electronegativity greater than 3.00. In formula (iii), the polar group R* is separated from the oxygen with a divalent spacer group A. Suitable spacer groups include divalent hydrocarbon radicals (e.g., alkylene radicals $C_{1-6}$ preferably $C_2$ optionally branched where preferably the carbon which is bonded to the oxygen is —$CH_2$—) or divalent cyclic hydrocarbon radicals (e.g., $C_{3-8}$). Suitable R* are mono, di, tri, tetra alkoxy e.g., lower $C_{1-6}$ alkoxy; alkyl carbonyl; (mono, di, tri, tetra alkoxy) carbonyl; (mono, di, tri, tetra alkoxy) alkyl carbonyl; alkyl carbonyloxy; (mono, di, tri, tetra alkoxy) alkyl carbonyloxy; (mono, di, tri, tetra alkoxy) carbonyloxy, alkyl dicarbonyloxy; (mono, di, tri, tetra alkoxy) dicarbonyloxy; (mono, di, tri, tetra alkoxyalkyl) dicarbonyloxy, amino; alkylamino; (mono, di, tri tetra alkoxy) alkylamino; and alkyl carbonyl amino and alkyl sulfonyl amino where each alkyl is preferably lower $C_{1-6}$ alkyl.

Other suitable polar substituents include:
cycloalkylcarbonylamino (lactams e.g., caprolactam)

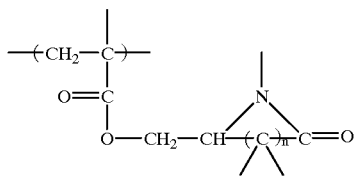

cycloalkylcarbonyloxyalkyl (lactones e.g., pantolactone)

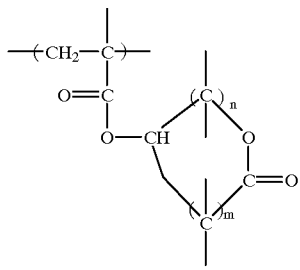

m, n independently=0, 1, 2, 3 . . .
and cycloalkyl dicarbonylalkyl (cyclic glycerin).

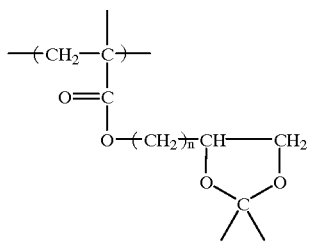

and sulfonylamino where R is alkyl, haloalkyl (trifluoromethyl) or cycloalkyl (camphor)

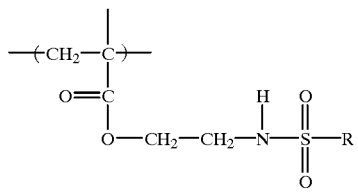

Other suitable non photoacid cleavable polar groups will be known to those skilled in the art. The polar substituent functions to improve film quality (planar coating with good adhesion), enhance thermal properties (glass transition temperature), improve solubility of resist in industry standard developers and improve development of resist while avoid thinning, cracking and swelling associated with excessive acid in the polymer. Preferred polar ester substituents for use in the present invention include methoxyethyl; methylcarbonyloxyethyl; ethoxycarbonyloxyethyl and ethoxydicarbonyloxyethyl.

Polar monomers were made generally by the slow addition of a slight excess of an acid chloride in methylene chloride solution to a cooled solution of an alcohol in methylene chloride containing a stoichiometric amount (with respect to the acid chloride) of acid scavenger (generally pyridine or triethylamine). The mixture was allowed to warm to room temperature overnight, filtered and washed sequentially with water, sodium bicarbonate and brine. Removal of the solvent and vacuum distillation from phenothiazine provided the requisite monomer in 50–90% yield.

The polymer also comprises a monomer having a photogenerated acid cleavable ester group. This monomer provides acid-sensitive esters groups pendant on the polymer backbone. The preferred acid labile pendant groups are organic ester groups which undergo a cleavage reaction in the presence of a photogenerated acid. Preferred ester groups are tertiary alkyl esters such as t-butyl esters of carboxylic acids. Other suitable ester groups include alicyclic ester substituents (e.g., $C_7$–$C_{12}$ preferably $C_{10}$–$C_{11}$) which are acid cleavable with secondary or tertiary attachment points such as adamantyl, norbornyl or isobornyl e.g., 2-methyl-2-adamantyl and 2-isobornyl; tetracyclodecenyl, dihydro dicyclopentadienyl cyclohexyl and 1 methyl cyclohexyl. However, it will be known to those skilled in the art that a wide range of other acid labile groups are operative in the invention. For instance, additional acid-sensitive groups are listed in H. Ito et al., U.S. Pat. No. 4,491,628, "Positive- and Negative-working Resist Compositions with Acid Generating Photoinitiator and Polymer with Acid Labile Groups Pendant from Polymer Backbone", and Handbook of Microlithography, Micromachining, and Microfabrication, Vol. 1: Microithography, Editor P. Raj-Coudhury, p. 321 (1997), the disclosure of which are incorporated herein by reference.

Preferred acid cleavable monomers useful in the practice of the present invention include the t-butyl esters of acrylates and methacrylates.

The polymer may also comprise other monomers to enhance the performance of the photoresist. For example, the polymer may comprise minor amounts of acrylic acid or methacrylic acid monomer (e.g., 5–20%) to enhance development. The polymer may also comprise other suitable monomers such as hydroxystyrene to enhance development and etch resistance or a silicon containing monomer (e.g. acrylate) to enhance oxygen plasma etch resistance for bilayer applications.

The polymer of the present invention will generally comprise about 25–75 mole % of the monomer with the polar ester substituent and about 25–75 mole % of the monomer with acid labile group.

The copolymer can be synthesized by standard free radical solution polymerization techniques known by those skilled in the art.

The second component of the resist composition is a photosensitive acid generator. Upon exposure to radiation, the radiation-sensitive acid generator generates a strong acid. Suitable acid generators include ionic iodonium sulfonates e.g., diaryl iodonium (alkyl or aryl) sulfonate. (aryl e.g., phenyl or benzyl) (triflates (e.g., triphenylsulfonium triflate or bis-(t-butyl phenyl) iodonium triflate), pyrogallol (e.g., trimesylate of pyrogallol), onium salts such as triarylsulfonium and diaryl iodonium hexafluorantimonates, hexafluoroarsenates, trifluoromethane sulfonates and others; trifluoromethanesulfonate esters of hydroxyimides, alpha—alpha'-bis-sulfonyl diazomethanes, sulfonate esters of nitro-substituted benzyl alcohols and napthoquinone-4-diazides and alkyl disulfones. Other suitable photoacid generators are disclosed in Reichmanis et al., review article (*Chemistry of Materials*, Vol. 3, page 395, 1991), the disclosures of which are incorporated herein by reference. Other suitable acid generators will be known to those skilled in the art.

The two-component resist composition preferably comprises about 1–10 weight % of the acid generator, and about 90–99 weight % of the polymer, more preferably about 1–5 weight % of the acid generator and the remaining as polymer.

The present invention also relates to a process for generating a resist image on a substrate comprising the steps of: (a) coating a substrate with a film comprising the resist composition of the present invention, (b) imagewise exposing the film to radiation, and (c) developing the image.

The first step involves coating the substrate with a film comprising the resist composition dissolved in a suitable solvent. Suitable substrates are comprised of silicon. Suitably, the surface of the substrate is cleaned by standard procedures before the film is disposed thereon. Suitable solvents for the composition include cyclohexanone, ethyl lactate, or propylene glycol methyl ether acetate (PGMEA). The film can be coated on the substrate using art-known techniques such as spin or spray coating, or doctor blading. Preferably, before the film has been exposed to radiation, the film is heated to an elevated temperature of about 90–150° C. for a short period of time of about 1 minute. The dried film has a thickness of about 0.2–5.0 microns, preferably about 0.3–1.2 microns. In the second step of the process, the film is imagewise exposed to radiation x-ray, e-beam or ultraviolet, suitably ultraviolet radiation suitably at a wavelength of about 13–250 nm (248/254 nm), preferably 193 nm. The preferred radiation source is ArF excimer or KrF excimer. Conveniently, due to the enhanced radiation sensitivity of the resist film, a resist film (1 micron thickness) is fully exposed with less than about 35 mJ/cm$^2$ of radiation, more preferably less than about 25 mJ/cm$^2$. The radiation is absorbed by the radiation-sensitive acid generator to generate free acid which with heating causes cleavage of the acid cleavable ester substituent and formation of the corresponding acid. Preferably, after the film has been exposed to radiation, the film is again heated to an elevated temperature of about 90–150° C. for a short period of time of about 1 minute.

The third step involves development of the image with a suitable solvent. Suitable solvents include an aqueous base, preferably an aqueous base without metal ions such as the industry standard developer tetramethyl ammonium hydroxide or choline. The resist composition of the present invention has high radiation sensitivity and provides positive images with high contrast and straight walls. The resist of the present invention can be readily developed in industry standard developer. Development is without unacceptable thinning or swelling. The resist has suitable thermal properties Tg and good adhesion and planarization. Uniquely, the dissolution property of the composition of the present invention can be varied by simply varying the composition of the polymer. Because the polymer has a very low optical density in the deep UV, the resist composition is uniquely suitable for use in the deep UV, especially at 193 nm.

The composition of the present invention may be used to make an integrated circuit assembly, such as an integrated circuit chip, multichip module, or circuit board. The integrated circuit assembly comprises a circuit formed on a substrate by the steps of: (a) coating a substrate with a film comprising the resist composition of the present invention, (b) imagewise exposing the film to radiation, (c) developing the image to expose the substrate, and (d) forming the circuit in the developed film on the substrate by art-known techniques. After the substrate has been exposed, circuit patterns can be formed in the exposed areas by coating the substrate with a conductive material such as conductive metals by art-known dry-etching techniques such as evaporation, sputtering, plating, chemical vapor deposition, or laser-induced deposition. The surface of the film can be milled to remove any excess conductive material. Dielectric materials may also be deposited by similar means during the process of making circuits. Inorganic ions such as boron, phosphorous, or arsenic can be implanted in the substrate in the process for making p or n doped circuit transistors. Other means for forming circuits are well known to those skilled in the art.

The following examples are detailed descriptions of methods of preparation and use of certain compositions of the present invention. The detailed preparations fall within the scope of, and serve to exemplify, the more generally described methods set forth above. The examples are presented for illustrative purposes only, and are not intended as a restriction on the scope of the invention.

EXAMPLE 1

Synthesis of Polymer Containing
2-Trifluoromethanesulfonyl aminoethyl Methacrylate:
2-Trifluoromethanesulfonylaminoethyl methacrylate (2.00 grams, 0.0076 mole), isobornyl methacrylate (1.70 grams, 0.0076 mole) and t-butyl methacrylate (0.54 gram, 0.0038 mole) were placed with 5 grams of tetrahydrofuran in a round bottom flask equipped with a condenser and a nitrogen inlet. 2,2'-azobisisobutyronitrile (0.13 gram) was added to this solution and stirred until completely dissolved. Then, the solution was evacuated with the aid of a Firestone valve and purged with nitrogen. The contents were heated to reflux for 18 hours. Afterwards, the solution was diluted with acetone (25 ml) and added dropwise into deionized water (300 ml). The precipitated polymer was filtered (frit), washed twice with deionized water (25 ml) and dried under vacuum at 60 degree C. Yield: 3.80 grams.

EXAMPLE 2

Synthesis of Polymer Containing
2-(10-Camphorsulfonyl amino)ethyl Methacrylate:
2-(10-Camphorsulfonylamino)ethyl methacrylate (3.43 grams, 0.01 mole), isobornyl methacrylate (2.22 grams, 0.01 mole), t-butyl methacrylate (0.95 gram, 0.0066 mole) and methacrylic acid (0.57 gram, 0.0066 mole) were placed with tetrahydrofuran (12 grams) in a round bottom flask equipped with a condenser and a nitrogen inlet. 2-2'-azobisisobutyronitrile (0.13 gram) was added to this solution and stirred until completely dissolved. Then, the solution was evacuated with the aid of a Firestone valve and purged with nitrogen. The contents where then heated to reflux for 18 hours. Afterwards, the solution was diluted with acetone (25 ml) and added dropwise into deionized water (600 ml). The precipitated polymer was filtered (frit), washed twice with deionized water (50 ml) dried under vacuum at 60 degree C. Yield: 6.72 grams.

EXAMPLE 3

Synthesis of Polymers Containing Pantolactone Methacrylate

Pantolactone methacrylate (3.47 grams, 0.0175 mole), isobornyl methacrylate (5.56 grams, 0.025 mole) and methacrylic acid (0.65 gram, 0.0075 mole) were placed with 30 grams of tetrahydrofuran (THF) in a round bottom flask equipped with a condenser and a nitrogen inlet. 2,2'-azobisisobutyronitrile (AIBN) (0.33 gram) was added to this solution and stirred until completely dissolved. Then, the solution was evacuated with the aid of a Firestone valve and purged with nitrogen. The contents were heated to reflux for 18 hours. Afterwards, the solution was diluted with acetone (30 ml) and added dropwise into hexanes (600 ml). The precipitated polymer was filtered (frit), washed twice with hexanes (50 ml) and dried under vacuum at 60 degree C. Yield: 8.09 grams.

EXAMPLE 4

Resist Performance

A resist composition was prepared with photoacid generator triphenyl sulfonium hexafluoro antimonate and a copolymer of isobornylmethacrylate (50%) and acetonxyethyl methacrylate. The resist composition was dissolved in PGMEA, spin coated on silicon wafer with film thickness of 0.8 microns. The film was heated to 150° C. for 1 minute, exposed to 193 nm (30–35 mJ/cm$^2$) and baked at 150° C. for 1 minute. The resist was developed in 0.26N tetramethylammonium hydroxide to give clean images.

Although this invention has been described with respect to specific embodiments, the details thereof are not to be construed as limitations for it will be apparent that various embodiments, changes, and modifications may be resorted to without departing from the spirit and scope thereof, and it is understood that such equivalent embodiments are intended to be included within the scope of this invention.

We claim:

1. A resist composition comprising a radiation-sensitive acid generator and a polymer comprising the reaction product of:
   (a) a monomer selected from methacrylate or acrylate having a photoacid cleavable ester substituent and
   (b) a monomer having the formula H$_2$C=CRR' where R is hydrido or methyl and R' is a polar non photoacid cleavable substituent having the formula

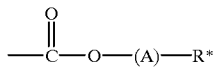

where A is C$_{1-6}$ alkylene and R* is a polar group having a heteroatom with an electronegativity greater than 3.00.

2. The composition of claim 1 wherein R* is selected from the group consisting of alkoxy, alkyl carbonyl, alkoxy carbonyl, alkoxy-substituted alkyl carbonyl, alkyl carbonyloxy, alkoxy-substituted alkyl carbonyloxy, alkoxy-substituted carbonyloxy, alkyl dicarbonyloxy, alkoxy-substituted dicarbonyloxy, alkoxyalkyl dicarbonyloxy, amino, alkylamino, alkoxy-substituted alkylamino, alkyl carbonyl amino, alkyl sulfonyl amido, cycloalkylcarbonylamino, cycloalkylcarbonyloxyalkyl, and cycloalkyldicarbonylalkyl, where each alkyl is lower C$_{1-6}$ alkyl.

3. The composition of claim 2 wherein R* is alkoxyethyl, alkoxycarbonyloxyethyl or alkoxydicarbonyloxyethyl.

4. The composition of claim 3 wherein the acid generator comprises an iodonium sulfonate.

5. The composition of claim 1 wherein the acid cleavable ester substituent is an alicylic substituent.

6. The composition of claim 1 wherein the polymer further includes acrylic acid or methacrylic acid.

7. The composition of claim 5 wherein the polymer further includes acrylic acid or methacrylic acid.

8. The composition of claim 7 wherein the polymer further includes hydroxystyrene monomer.

9. The composition of claim 6 wherein the polymer further includes an acrylate or methacrylate monomer containing silicon.

10. A resist composition comprising a radiation-sensitive acid generator and a polymer comprising the reaction product of:
    (a) a monomer selected from methacrylate or acrylate having a photoacid cleavable organic ester substituent and
    (b) a monomer having the formula H$_2$C=CRR' where R is methyl or hydrido and R' is a polar non photoacid cleavable substituent having the formula

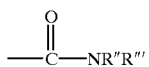

where R" and R'" are selected from the group consisting of hydrido, C$_{1-6}$ alkyl and AR*, A is C$_{1-6}$ alkylene, and R* is polar group having a heteroatom with an electronegativity greater than 3.00, with the proviso that R" and R'" are not both hydrido.

11. The composition of claim 10 wherein R is methyl.

12. The composition of claim 10 wherein at least one of R" and R'" is AR*.

13. The composition of claim 12 wherein R* is selected from the group consisting of alkoxy, alkyl carbonyl, alkoxy carbonyl, alkoxy-substituted alkyl carbonyl, alkyl carbonyloxy, alkoxy-substituted alkyl carbonyloxy, alkoxy-substituted carbonyloxy, alkyl dicarbonyloxy, alkoxy-substituted dicarbonyloxy, alkoxyalkyl dicarbonyloxy, amino, alkylamino, alkoxy-substituted alkylamino, alkyl carbonyl amino, alkyl sulfonyl amido, cycloalkylcarbonylamino, cycloalkylcarbonyloxyalkyl, and cycloalkyldicarbonylalkyl, where each alkyl is lower C$_{1-6}$ alkyl.

14. The composition of claim 13 wherein R* is alkoxyethyl, alkoxycarbonyloxyethyl or alkoxydicarbonyloxyethyl.

15. The composition of claim 14 wherein the acid generator comprises an iodonium sulfonate.

16. A resist composition comprising a radiation-sensitive acid generator and a polymer comprising the reaction product of:
    (a) a monomer selected from methacrylate or acrylate having a photoacid cleavable alicyclic ester substituent and
    (b) a monomer having the formula H$_2$C=CRR' where R is hydrido or methyl and R' is a polar non photoacid cleavable substituent having the formula —CN or

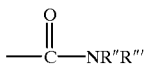

where R" and R'" are independently hydrido, $C_{1-6}$ alkyl or AR*, A is $C_{1-6}$ alkylene, and R* is polar group having a heteroatom with an electronegativity greater than 3.00.

17. The composition of claim 16 wherein R' is —CN.
18. The composition of claim 16 wherein R' is

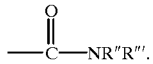

19. The composition of claim 18 wherein at least one of R" and R'" is AR*.
20. The composition of claim 19 wherein R* is selected from the group consisting of alkoxy, alkyl carbonyl, alkoxy carbonyl, alkoxy-substituted alkyl carbonyl, alkyl carbonyloxy, alkoxy-substituted alkyl carbonyloxy, alkoxy-substituted carbonyloxy, alkyl dicarbonyloxy, alkoxy-substituted dicarbonyloxy, alkoxyalkyl dicarbonyloxy, amino, alkylamino, alkoxy-substituted alkylamino, alkyl carbonyl amino, alkyl sulfonyl amido, cycloalkylcarbonylamino, cycloalkylcarbonyloxyalkyl, and cycloalkyldicarbonylalkyl, where each alkyl is lower $C_{1-6}$ alkyl.
21. The composition of claim 20 wherein R* is alkoxyethyl, alkoxycarbonyloxyethyl or alkoxydicarbonyloxyethyl.
22. The composition of claim 21 wherein the acid generator comprises an iodonium sulfonate.
23. The composition of claim 16 wherein the photoacid cleavable alicyclic ester substituent is selected from the group consisting of adamantyl, 2-alkyl adamantyl, norbornyl, isobornyl, tetracyclodecenyl, dihydro dicyclopentadienyl cyclohexyl and 1-methylcyclohexyl.
24. The composition of claim 5 wherein the photoacid cleavable alicyclic ester substituent is selected from the group consisting of adamantyl, norbornyl, isobornyl, tetracyclodecenyl, dihydro dicyclopentadienyl cyclohexyl and 1-methylcyclohexyl.
25. A process for generating a resist image on a substrate comprising the steps of:
(a) coating a substrate with a film comprising a radiation-sensitive acid generator and a polymer comprising the reaction product of:
    (i) a monomer selected from methacrylate or acrylate having a photoacid cleavable ester substituent and
    (ii) a monomer having the formula $H_2C=CRR'$ where R is hydrido or methyl and R' is a polar non photoacid cleavable substituent having the formula

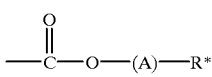

where A is $C_{1-6}$ alkylene and R* is a polar group having a heteroatom with an electronegativity greater than 3.00;
(b) imagewise exposing the film to radiation to form a latent image therein; and
(c) developing the latent image with a developer.
26. The process of claim 10 wherein R* is selected from the group consisting of alkoxy, alkyl carbonyl, alkoxy carbonyl, alkoxy-substituted alkyl carbonyl, alkyl carbonyloxy, alkoxy-substituted alkyl carbonyloxy, alkoxy-substituted carbonyloxy, alkyl dicarbonyloxy, alkoxy-substituted dicarbonyloxy, alkoxyalkyl dicarbonyloxy, amino, alkylamino, alkoxy-substituted alkylamino, alkyl carbonyl amino, alkyl sulfonyl amido, cycloalkylcarbonylamino, cycloalkylcarbonyloxyalkyl, and cycloalkyldicarbonylalkyl, where each alkyl is lower $C_{1-6}$ alkyl.
27. The process of claim 25 wherein R* is alkoxyethyl, alkoxycarbonyloxyethyl or alkoxydicarbonyloxyethyl.
28. The process of claim 27 wherein the acid generator comprises an iodonium sulfonate.
29. The process of claim 25 wherein the acid cleavable ester substituent is an alicyclic substituent.
30. The process of claim 25 wherein the polymer further includes acrylic acid or methacrylic acid.
31. The process of claim 29 wherein the polymer further includes acrylic acid or methacrylic acid.
32. The process of claim 31 wherein the polymer further includes hydroxystyrene monomer.
33. The process of claim 30 wherein the polymer further includes an acrylate or methacrylate monomer containing silicon.
34. A process for generating a resist image on a substrate comprising the steps of:
(a) coating a substrate with a film comprising a radiation-sensitive acid generator and a polymer comprising the reaction product of:
    (i) a monomer selected from methacrylate or acrylate having a photoacid cleavable ester substituent and
    (ii) a monomer having the formula $H_2C=CRR'$ where R is hydrido or methyl and R' is a polar non photoacid cleavable substituent having the formula

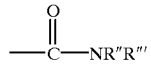

where R" and R'" are selected from the group consisting of hydrido, $C_{1-6}$ alkyl and AR* A is $C_{1-6}$ alkylene, and R* is polar group having a heteroatom with an electronegativity greater than 3.00, with the proviso that R" and R'" are not both hydrido;
(b) imagewise exposing the film to radiation to form a latent image therein; and
(c) developing the latent image with a developer.
35. The process of claim 34 wherein R is methyl.
36. The process of claim 34 wherein at least one of R" and R'" is AR*.
37. The process of claim 36 wherein R* is selected from the group consisting of alkoxy, alkyl carbonyl, alkoxy carbonyl, alkoxy-substituted alkyl carbonyl, alkyl carbonyloxy, alkoxy-substituted alkyl carbonyloxy, alkoxy-substituted carbonyloxy, alkyl dicarbonyloxy, alkoxy-substituted dicarbonyloxy, alkoxyalkyl dicarbonyloxy, amino, alkylamino, alkoxy-substituted alkylamino, alkyl carbonyl amino, alkyl sulfonyl amido, cycloalkylcarbonylamino, cycloalkylcarbonyloxyalkyl, and cycloalkyldicarbonylalkyl, where each alkyl is lower $C_{1-6}$ alkyl.
38. The process of claim 37 wherein R* is alkoxyethyl, alkoxycarbonyloxyethyl or alkoxydicarbonyloxyethyl.
39. The process of claim 38 wherein the acid generator comprises an iodonium sulfonate.
40. A process for generating a resist image on a substrate comprising the steps of:
(a) coating a substrate with a film comprising a radiation-sensitive acid generator and a polymer consisting of the reaction product of:

(i) a monomer selected from methacrylate or acrylate having a photoacid cleavable alicyclic ester substituent and
(ii) a monomer having the formula $H_2C=CRR'$ where R is hydrido or methyl and R' is a polar non photoacid cleavable substituent having the formula —CN or

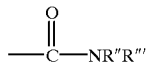

where R" and R'" are independently hydrido, $C_{1-6}$ alkyl or AR*, A is $C_{1-6}$ alkylene, and R* is polar group having a heteroatom with an electronegativity greater than 3.00;

(b) imagewise exposing the film to radiation to form a latent image therein; and
(c) developing the latent image with a developer.

41. The process of claim 40 wherein R' is —CN.
42. The process of claim 40 wherein R' is

43. The process of claim 42 wherein at least one of R" and R'" is AR*.

44. The process of claim 43 wherein R* is selected from the group consisting of alkoxy, alkyl carbonyl, alkoxy carbonyl, alkoxy-substituted alkyl carbonyl, alkyl carbonyloxy, alkoxy-substituted alkyl carbonyloxy, alkoxy-substituted carbonyloxy, alkyl dicarbonyloxy, alkoxy-substituted dicarbonyloxy, alkoxyalkyl dicarbonyloxy, amino, alkylamino, alkoxy-substituted alkylamino, alkyl carbonyl amino, alkyl sulfonyl amido, cycloalkylcarbonylamino, cycloalkylcarbonyloxyalkyl, and cycloalkyldicarbonylalkyl, where each alkyl is lower $C_{1-6}$ alkyl.

45. The process of claim 44 wherein R* is alkoxyethyl, alkoxycarbonyloxyethyl or alkoxydicarbonyloxyethyl.

46. The process of claim 45 wherein the acid generator comprises an iodonium sulfonate.

47. The process of claim 40 wherein the photoacid cleavable alicyclic ester substituent is selected from the group consisting of adamantyl, 2-alkyl adamantyl, norbornyl, isobornyl, tetracyclodecenyl, dihydro dicyclopentadienyl cyclohexyl and 1-methylcyclohexyl.

* * * * *